United States Patent
Sprague et al.

(10) Patent No.: US 10,557,221 B1
(45) Date of Patent: Feb. 11, 2020

(54) COVERS FOR ELECTRONIC DISPLAY ELEMENTS WITH IMPROVED VISIBILITY

(71) Applicant: Amazon Technologies, Inc., Seattle, WA (US)

(72) Inventors: Robert Arthur Sprague, Saratoga, CA (US); John Michael Cesaratto, Campbell, CA (US); Maung Aung, Union City, CA (US)

(73) Assignee: Amazon Technologies, Inc., Seattle, WA (US)

(*) Notice: Subject to any disclaimer, the term of this patent is extended or adjusted under 35 U.S.C. 154(b) by 0 days.

(21) Appl. No.: 16/295,718

(22) Filed: Mar. 7, 2019

(51) Int. Cl.
*D03D 1/00* (2006.01)
*H05K 5/03* (2006.01)
*H05K 5/00* (2006.01)

(52) U.S. Cl.
CPC ............. *D03D 1/00* (2013.01); *H05K 5/0017* (2013.01); *H05K 5/03* (2013.01); *D03D 2700/0174* (2013.01)

(58) Field of Classification Search
CPC ............. D03D 1/00; D03D 2700/0174; H05K 5/0017; H05K 5/03
USPC ....................... 40/448, 606; 368/10
See application file for complete search history.

(56) References Cited

U.S. PATENT DOCUMENTS

| | | | | |
|---|---|---|---|---|
| 3,978,647 A | * | 9/1976 | Kosaka | D02G 1/024 57/205 |
| 4,083,137 A | * | 4/1978 | Rozmanith | B42F 5/02 206/447 |
| 4,234,907 A | * | 11/1980 | Daniel | A41D 27/085 139/420 R |
| 4,710,981 A | * | 12/1987 | Sanchez | A41D 27/08 2/115 |
| 5,183,323 A | * | 2/1993 | Daniel | D03D 1/0088 362/556 |
| 5,454,492 A | * | 10/1995 | Hunter | B67D 3/0009 150/154 |
| 5,703,703 A | * | 12/1997 | Yamate | G02B 5/32 359/1 |
| D421,262 S | * | 2/2000 | Warren | D14/214 |
| 6,793,360 B2 | * | 9/2004 | Goslee | D03D 1/0088 362/556 |
| 7,234,853 B2 | * | 6/2007 | Givoletti | B60R 13/02 160/10 |
| D551,656 S | * | 9/2007 | Ritsher | D14/216 |

(Continued)

OTHER PUBLICATIONS https://www.mobilefun.co.uk/gear4-houseparty-4-ipod-speakers-21645 ; extracted Sep. 27, 2019 (Year: 2011).*

*Primary Examiner* — Adrian S Wilson
(74) *Attorney, Agent, or Firm* — Eversheds Sutherland (US) LLP

(57) ABSTRACT

Systems, methods, and computer-readable media are disclosed for covers for electronic display elements with improved visibility. In one embodiment, an example cover for an electronic device may include a first fiber segment, a second fiber segment coupled to the first fiber segment, where the first fiber segment and the second fiber segment together form an opening in the cover, and an optically clear adhesive. A first portion of the optically clear adhesive may be disposed in the opening. The optically clear adhesive may have a refractive index value of between about 1.3 and about 1.6, and a first thickness of the first portion may be less than a second thickness of the cover. The cover may be transmissive to visible light.

20 Claims, 7 Drawing Sheets

(56) References Cited

U.S. PATENT DOCUMENTS

| | | | |
|---|---|---|---|
| D555,636 S * | 11/2007 | Chen | D14/216 |
| D571,359 S * | 6/2008 | Chang | D14/216 |
| D573,579 S * | 7/2008 | Yamaguchi | D14/168 |
| D574,363 S * | 8/2008 | Laituri | D14/168 |
| D597,529 S * | 8/2009 | Tan | D14/214 |
| D616,420 S * | 5/2010 | Morimoto | D14/216 |
| D706,743 S * | 6/2014 | Lukic | D14/204 |
| 2006/0087832 A1* | 4/2006 | Peng | D03D 15/00 362/103 |
| 2012/0121924 A1* | 5/2012 | Miller | B21D 31/04 428/596 |
| 2013/0010004 A1* | 1/2013 | Ligorano | G02B 6/04 345/690 |
| 2014/0140556 A1* | 5/2014 | Yim | H04R 1/023 381/332 |
| 2017/0095043 A1* | 4/2017 | Weber | A44C 5/00 |

* cited by examiner

US 10,557,221 B1

COVERS FOR ELECTRONIC DISPLAY ELEMENTS WITH IMPROVED VISIBILITY

BACKGROUND

Electronic devices may include displays to present content to users. Content may include text, images, videos, and so forth. In some instances, displays and/or electronic devices may be covered with fabrics or other covers. For example, users may personalize devices using fabrics or other covers to make the device aesthetically pleasing and/or to resemble furniture or art pieces. However, such covers may reduce visibility of displays. In some instances, fabrics may cause a venetian blind effect that limits viewing angles of displays. Accordingly, device covers with reduced negative impact on visibility of displays may be desired.

Figure 1:
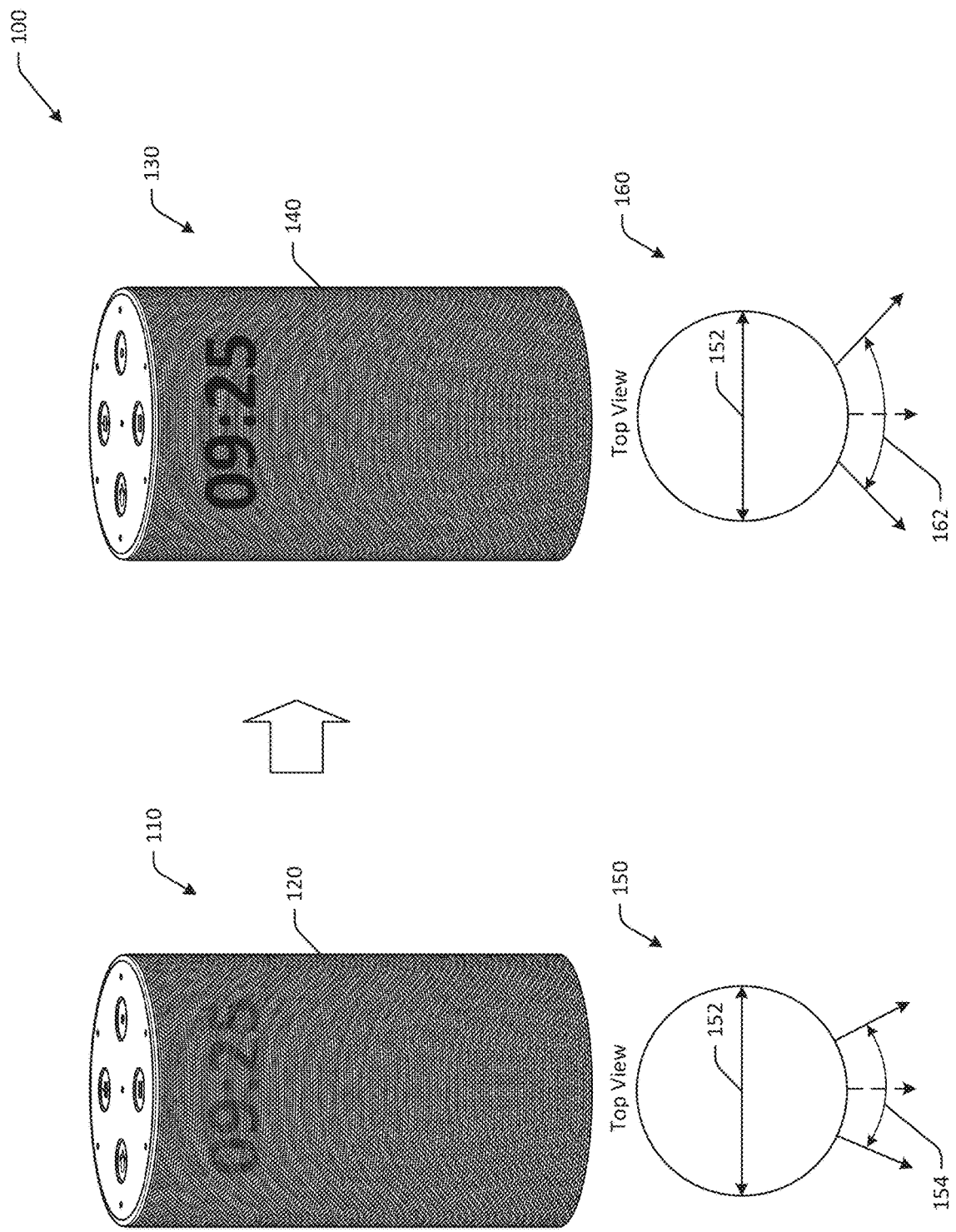
FIG. 1 is a schematic illustration of an example use case of a fabric cover for an electronic display element with improved visibility in accordance with one or more embodiments of the disclosure.

The detailed description is set forth with reference to the accompanying drawings. The drawings are provided for purposes of illustration only and merely depict example embodiments of the disclosure. The drawings are provided to facilitate understanding of the disclosure and shall not be deemed to limit the breadth, scope, or applicability of the disclosure. The use of the same reference numerals indicates similar, but not necessarily the same or identical components. Different reference numerals may be used to identify similar components. Various embodiments may utilize elements or components other than those illustrated in the drawings, and some elements and/or components may not be present in various embodiments. The use of singular terminology to describe a component or element may, depending on the context, encompass a plural number of such components or elements and vice versa.

DETAILED DESCRIPTION

Overview

Electronic devices may be used to consume content, such as text-based content, image-based content, video-based content, and so forth. For example, electronic devices may be configured to present information, such as a date or time, at a display element, and/or to render locally stored content, streamed content, and the like. Electronic devices may include a variety of devices, such as electronic reader (e-reader) devices, computers, smartphones, tablet computers, televisions, wearable devices, display devices, and so forth that may be used to present digital content. Electronic devices may therefore include display elements that may be used to present content to users.

Electronic devices may include various types of display elements, such as light emitting diode (LED) displays, backlit displays, frontlit displays, and so forth. In some instances, displays of electronic devices may be hidden behind covers, such as fabric covers. For example, a voice assistant device may include an LED display element that is configured to present time when motion is detected. The LED display element may be hidden, in that the LED display element may not be visible when the LED display element is not active. For example, the LED display element may be positioned behind a cloth cover that hides the LED display element from view. When the LED display element is active, the light emitted from the LED display element may be visible through the cloth cover, while when the LED display element is inactive, the LED display element may not be visible, thereby providing an aesthetically pleasing device. Accordingly, devices with hidden display elements may include display elements that are hidden when turned off, but visible when turned on. Such devices may appear as furniture, art works, and/or other home products.

However, such display covers may reduce visibility of display elements. In some instances, fabrics may cause a venetian blind effect that limits viewing angles of display elements. For example, certain cloth or fabric covers may cause a narrow angular field of view due to optical transmission of the cover, resulting in a venetian blind effect on light emitted from the display element.

Embodiments of the disclosure include covers for electronic display elements that improve the angular field of view by coating a transparent fluid on an inside of the fabric cover (e.g., the side of the cover in contact with or adjacent to the display element, etc.) ("inside" and "outside" as used herein are for illustrative purposes only, and do not indicate absolute positions). The transparent fluid may be absorbed partly into the fabric of the cover, and may fill the spaces between fibers that form the cloth or other cover. In some embodiments, fibers may include natural fibers, such as wool or cotton, synthetic fibers, such as nylon, polyester, or plastic, cellulose fibers, acrylic fibers, metal fibers, or any other suitable type of fiber.

The transparent fluid may be formed of a material that has an index of refraction greater than air, such as a refractive index value of about 1.5. Accordingly, certain embodiments may improve visibility of hidden display elements without impacting the appearance of the fabric on the outside. Certain embodiments may improve brightness and contrast of hidden display elements by increasing an amount of light transmission through the fabric.

Referring to FIG. 1, an example use case 100 of a cover for electronic display elements with improved visibility is illustrated in accordance with one or more embodiments of the disclosure. Although discussed in the context of fabric, other embodiments may include different types of covers, such as plastic covers (e.g., stamped plastic covers, 3D printed plastic covers, etc.), metal covers, and other types of covers. Some embodiments may include cross-hatched fibers that form one or more openings through which light may pass.

In FIG. 1, a first device 110 with a first hidden display element 120 is illustrated. The first hidden display element 120 may be a display element that includes light colored, such as white colored, LEDs, and may present a current time. For example, the first hidden display element 120 may read 09:25, representing a current time. The first hidden display element 120 may be covered with a typical fabric cover. As a result, the visibility of the first hidden display element 120 may be limited, and may appear cross-hatched in some instances due to the fabric of the display cover. In addition, the cover may absorb some of the emitted light from the first hidden display element 120. As a result, the appearance and visibility of the first hidden display element 120 may be limited.

In contrast, a second device 130 with a second hidden display element 140 is illustrated. The second device 130 may be the same as the first device 110, and may have the same display element, but may include a fabric cover as described herein. For example, the second hidden display element 140 may be a flexible display element that includes light colored, such as white colored, LEDs, and may present a current time. For example, the second hidden display element 140 may read 09:25, representing a current time. The second hidden display element 140 may be covered with a fabric cover as described herein. The fabric cover may include a layer of clear or transparent material on an inner surface of the fabric cover (e.g., facing inwards towards the display element, etc.), as well as some material filled in openings or holes between fibers of the fabric from which the fabric cloth is formed. As a result, the visibility of the second hidden display element 140 may be improved relative to the first hidden display element 120. In addition, in some embodiments, cross-hatching appearance may be improved, as well as brightness and contrast of the second hidden display element 140. As a result, the appearance and visibility of the second hidden display element 140 may be improved.

Specifically, the first device 110 is illustrated in top view 150. In some embodiments, the first device 110 may be a cylindrical device having a diameter 152 of about 100 millimeters. The first hidden display element 120 may have a width of about 40 millimeters. The first hidden display element 120 may be flexible and mounted to the cylindrical housing of the first device 110. The first hidden display element 120 may have a first angular field of view 154 of, for example, about 45 degrees.

In contrast, the second device 130 is illustrated in top view 160. In some embodiments, the second device 130 may be the same cylindrical device having the diameter 152 of about 100 millimeters. The second hidden display element 140 may also have a width of about 40 millimeters, and may be flexible and mounted to the cylindrical housing of the second device 130. However, the second hidden display element 140 may have a second angular field of view 162 of, for example, about 90 degrees, or, in some instances, about 180 degrees. The second angular field of view 162 may be greater than the first angular field of view as a result of the fabric cover that covers the second hidden display element 120, and allows improved light transmission. Angular fields of view may be defined as the total range of angle from which the respective display element is visible. In some instances, angular field of view may be determined by doubling an angular range from center to an edge at which the display element is visible (e.g., 22 degrees*2=44 degrees, etc.). The fabric cover that covers the second hidden display element 140 may be the same color as the fabric cover that covers the first hidden display element 120, but because of the refractive index material layer, optical transmission may be improved and light absorption and/or blockage by the fabric may be reduced.

Certain embodiments include fabric covers that improve visibility while minimizing impact on the appearance of the cloth of the fabric from the outside, or from the viewer's position. In such instances, the index of refraction layer applied to the inside surface of the fabric cover may positioned to prevent seepage and/or leaching out of the perimeter of the fabric cover and/or through openings in the cloth. The amount of index of refraction material applied may be controlled to prevent overexposure or squeezing in between the cloth fibers to coat the outside surface of the fabric.

Accordingly, in FIG. 1, the flexible display elements of the second hidden display element 140 may output light that impinges on a woven fabric cover that is disposed about the flexible display element. The woven fabric cover may have an inside surface that faces the flexible display element, and an outside surface that faces outward with respect to the cylindrical housing of the second device 130. The woven fabric cover may include a first yarn segment, and a second yarn segment coupled to the first yarn segment. The first yarn segment and the second yarn segment together may form a portion of the outside surface, and may form an opening disposed between the first yarn segment and the second yarn segment. The opening may extend through a first thickness of the woven fabric cover from the outside surface to the inside surface. A first portion of an optically clear adhesive may be disposed on the first yarn segment and the second yarn segment. The optically clear adhesive may have a refractive index value of between about 1.1 and about 1.9, such as about 1.5. A second portion of the optically clear adhesive may be disposed in the opening. Light output by the flexible display element may be visible through the woven fabric cover. In some embodiments, the refractive index material, such as the optically clear adhesive, may be patterned over a portion of fabric using, for example, an inkjet process, so as to cover an area adjacent to a display element.

A refractive index value of an optical medium, such as the optically clear adhesive, is a dimensionless number that indicates how light, or any other radiation, propagates through that specific medium. A refractive index value of a specific medium is defined as n=c/v where c is the speed of light in vacuum and v is the speed of light in the substance. For example, the refractive index value of water is 1.33, meaning that light travels 1.33 times faster in a vacuum than it does in water. Other methods of calculating or measuring refractive index values may be used. The optically clear adhesive used at the inside surface of the fabric cover may have a refractive index value of between about 1.1 and about 1.9, such as about 1.5.

Embodiments of the disclosure include fabric covers for electronic display elements with improved visibility. Certain embodiments may improve visual appearance of uniformity of light at different angles, as well as increase a viewing angle of display elements covered by fabrics. Certain embodiments may improve light intensity at various angles relative to display elements covered by traditional fabrics. Some embodiments may allow for viewing angles of display elements covered with fabric of up to 180 degrees, or substantially equal to a viewing angle of an uncovered display element. While described in the context of LED display elements, aspects of this disclosure are more broadly applicable to other forms of display elements, including reflective displays and frontlight displays.

Example embodiments of the disclosure provide a number of technical features or technical effects. For example, in accordance with example embodiments of the disclosure, certain embodiments of the disclosure may mitigate light blockage and/or absorption issues, improve light transmission, and improve visibility and/or readability of content. The above examples of technical features and/or technical effects of example embodiments of the disclosure are merely illustrative and not exhaustive.

One or more illustrative embodiments of the disclosure have been described above. The above-described embodiments are merely illustrative of the scope of this disclosure and are not intended to be limiting in any way. Accordingly, variations, modifications, and equivalents of the embodiments disclosed herein are also within the scope of this disclosure. The above-described embodiments and additional and/or alternative embodiments of the disclosure will be described in detail hereinafter through reference to the accompanying drawings.

Illustrative Embodiments and Use Cases

Figure 2:
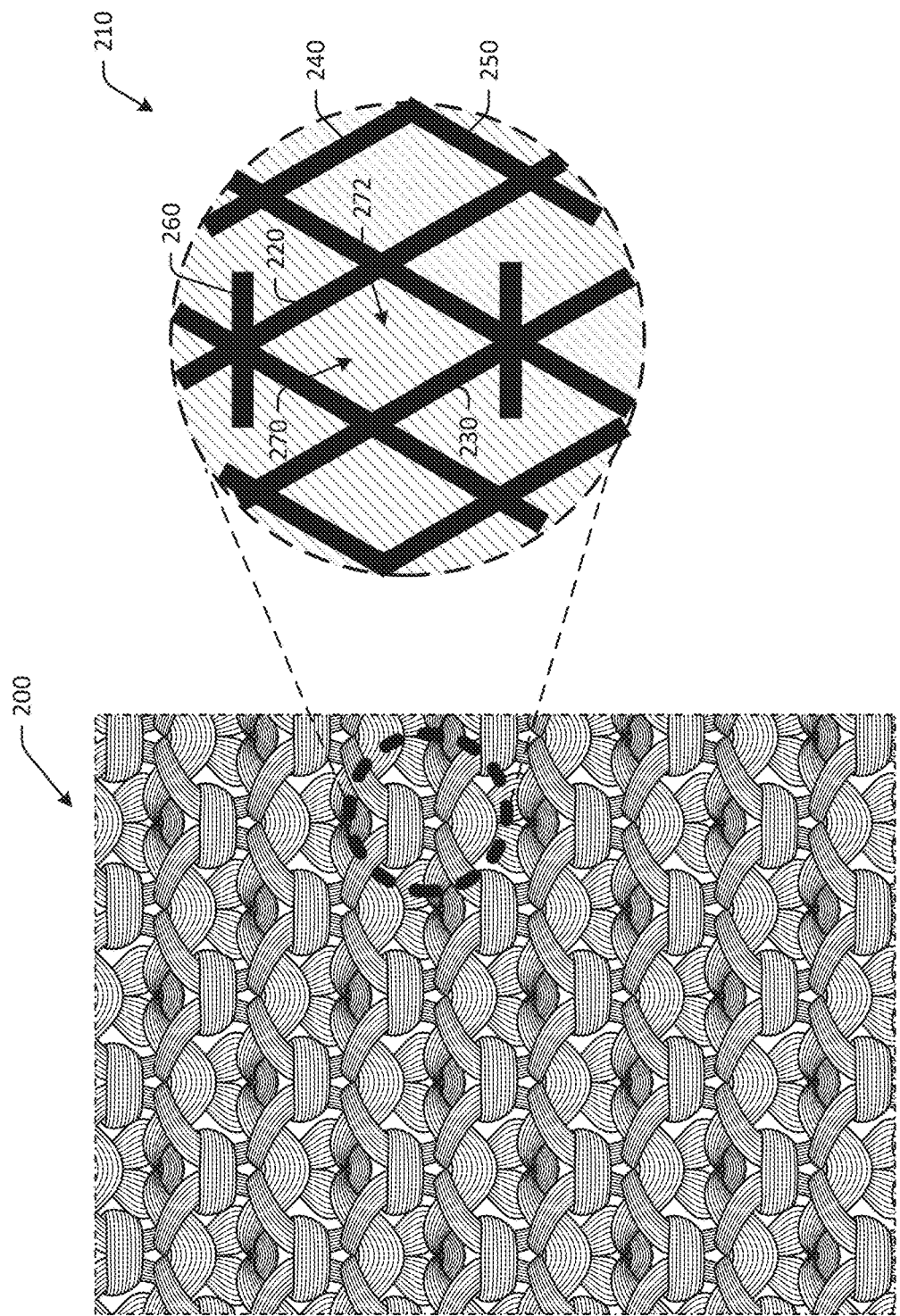
FIG. 2 is a schematic illustration of a fabric cover for electronic display elements with improved visibility in accordance with one or more embodiments of the disclosure.

FIG. 2 is a schematic illustration of a cover 200 for electronic display elements with improved visibility in accordance with one or more embodiments of the disclosure. Other embodiments may include additional or fewer components. FIG. 2 illustrates an example embodiment of a fabric cover that includes a certain fabric weaving. Other embodiments may have different weaving or knitting configurations. Although discussed in the context of fabric, other embodiments may include different types of covers, such as plastic covers (e.g., stamped plastic covers, 3D printed plastic covers, etc.), metal covers, and other types of covers.

In FIG. 2, a portion of the fabric cover 200 is illustrated. The fabric cover 200 may be the fabric cover that covers the second hidden display element 140 in FIG. 1. The fabric cover 200 may be formed of cotton fibers or yarn, or any other suitable material, such as polyester. The fabric cover 200 illustrated in FIG. 2 is a front view of the fabric cover 200.

A detail view 210 of a section of the fabric cover 200 is depicted in FIG. 2. As illustrated in FIG. 2, the fabric cover 200 may include a first yarn segment 220, a second yarn segment 230, a third yarn segment 240, a fourth yarn segment 250, a sixth yarn segment 260, and so forth. Yarn segments may be portions of threads that are knitted, woven, or otherwise coupled to form the fabric cover 200. In some embodiments, synthetic materials may be used to form fibers and/or segments that are coupled to form the fabric cover 200.

Some or all of the respective first yarn segment 220, second yarn segment 230, third yarn segment 240, fourth yarn segment 250, and sixth yarn segment 260 may together form a portion of a first surface of the fabric cover 200. For example, the first yarn segment 220 and the second yarn segment 230 may together form a portion of the outside surface of the fabric cover 200, where the outside surface is visible to a user when looking at a display element covered by the fabric cover 200.

The first yarn segment 220 and the second yarn segment 230 may be parallel to each other at certain points along the stitching or weaving of the fabric cover 200. The first yarn segment 220 and the second yarn segment 230 may at least partially form an opening 270 that is disposed between the first yarn segment 220 and the second yarn segment 230. The opening 270 may extend through a first thickness of the fabric cover 200 from the outside surface to the inside surface.

In typical fabric covers, the opening 270 may be filled with air. However, in FIG. 2, the opening 270, as well as some or all other openings in the fabric cover 200, may be filled with a material having a certain refractive index value. For example, the opening 200 may be at least partially filled with a clear polymeric plastic or optically clear adhesive 272 having a refractive index value of about 1.5. The optically clear adhesive 272 may be in liquid or solid form. In some embodiments, the optically clear adhesive 272 may be an adhesive tape or an acrylic adhesive. In some embodiments, the refractive index value may be greater than the refractive index value of air. In one example, the refractive index value of a polycarbonate material may be 1.59 (e.g., n=1.59), whereas a or poly(methyl methacrylate) (PMMA) material may have a refractive index value of about 1.49.

Figure 3:
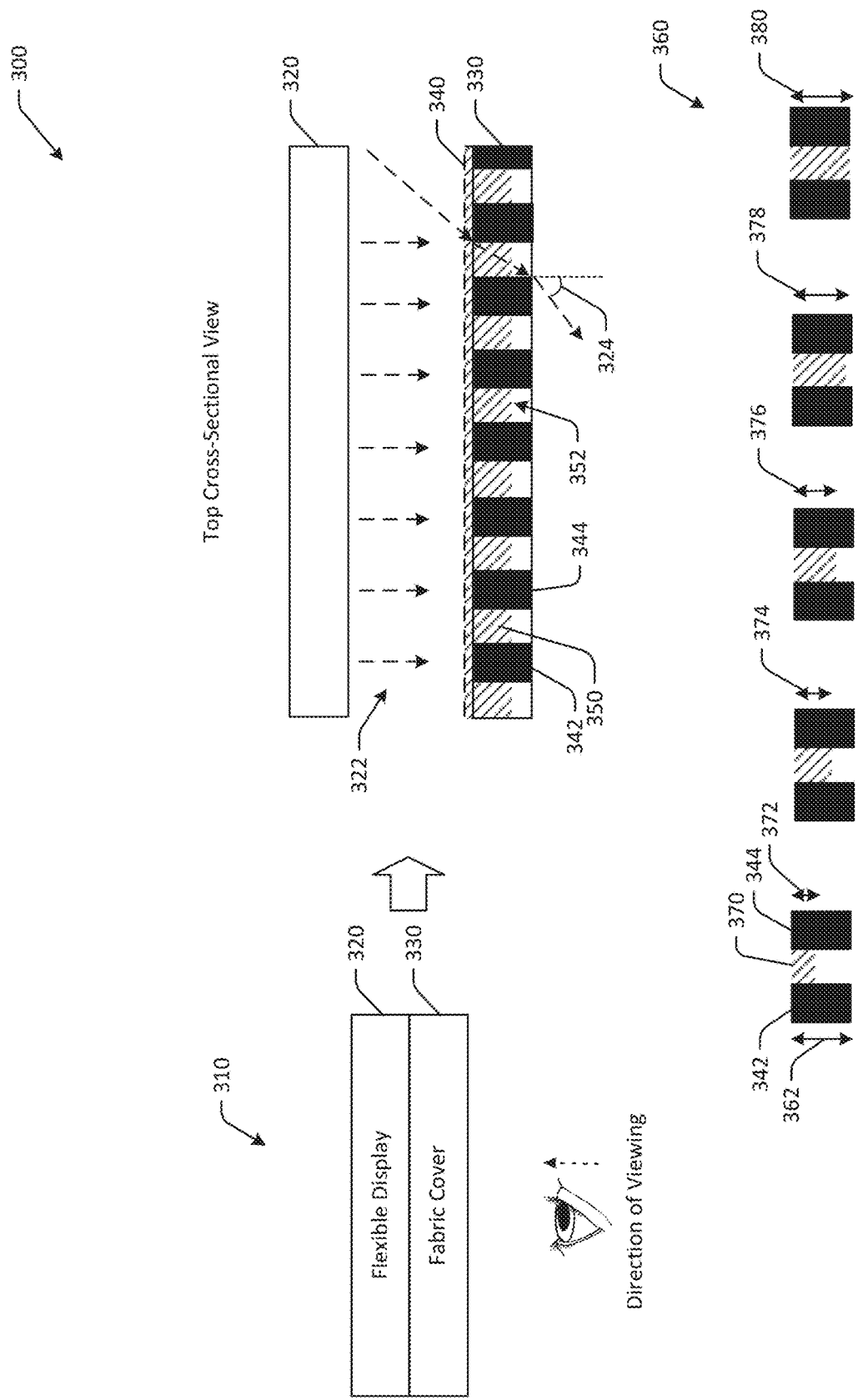
FIG. 3 is a schematic illustration of a cross-sectional view of a fabric cover and flexible electronic display element with different fill levels of refractive index material in accordance with one or more embodiments of the disclosure.

Accordingly, the fabric cover 200 may include a first portion of an optically clear adhesive disposed in the opening 270 between the first yarn segment and the second yarn segment. The optically clear adhesive may have a refractive index value of between about 1.3 and about 1.6. As illustrated in FIG. 3, the optically clear adhesive in the opening 270 may have a first thickness that is less than a second thickness of the fabric cover 200.

Light may be visible through the fabric cover 200. For example, light emitted from a display element covered by the fabric cover 200 may be blocked by the respective first yarn segment 220, second yarn segment 230, third yarn segment 240, fourth yarn segment 250, and sixth yarn segment 260. Some light may be absorbed by the fabric cover 200, while other light may be reflected from the respective yarn segments. Some light emitted from the display element may pass through the openings in the fabric cloth 200, such as the opening 270.

By including the material with the refractive index value of about 1.5, light that impinges the fabric may be redirected to (and through) the openings in the fabric cover 200, thereby improving light transmission, light visibility, brightness, and contrast of the display element.

FIG. 3 is a schematic illustration of a cover and flexible electronic display element 300 with different fill levels of refractive index material in accordance with one or more embodiments of the disclosure. Other embodiments may include additional or fewer components. FIG. 3 illustrates an example embodiment of a fabric structure that includes openings in a certain orientation. Other embodiments may have different opening orientations, sizes, density, and/or arrangements. Although discussed in the context of fabric, other embodiments may include different types of covers, such as plastic covers (e.g., stamped plastic covers, 3D printed plastic covers, etc.), metal covers, and other types of covers. The illustration of FIG. 3 is not to scale, and may not be illustrated to scale with respect to other figures. The fabric cover illustrated in FIG. 3 may be the same fabric cover discussed with respect to the second hidden display element in FIG. 1 or the fabric cover of FIG. 2.

In FIG. 3, a flexible display element 320 and a fabric cover 330 are illustrated in a top view 310. The flexible display element 320 may be viewed through the fabric cover 330. The fabric cover 330 may be formed of various materials, such as cotton. The materials may be woven, knitted, or otherwise coupled to form the fabric cover 330.

As illustrated in the top cross-sectional view in FIG. 3, the fabric cover 330 may include an optically clear adhesive layer 340 disposed on a second surface of the fabric cover 330. The second surface may be an inside surface, or a surface adjacent to the flexible display element 320. In some embodiments, a thickness of the optically clear adhesive layer 340 may be less than or equal to a thickness of the fabric that forms the fabric cover 330.

A first portion of optically clear adhesive may form the optically clear adhesive layer 340. A second portion of optically clear adhesive may at least partially fill openings in the fabric that forms the fabric cover 330. For example, as illustrated in FIG. 3, the fabric that forms the fabric cover 330 may include a first fiber 342, and a second fiber 344 adjacent to the first fiber 342. A first opening may be formed between the first fiber 342 and the second fiber 344. The first opening may be at least partially filled with a second portion 350 of the optically clear adhesive. Some or all of the openings in the fabric may be filled with the optically clear adhesive. The fabric cover 330 may therefore include a first portion 340 of an optically clear adhesive disposed on the fibers or yarn segments of the fabric cover 330, so as to form a portion of the inside surface of the fabric cover 330, and a second portion 350 of the optically clear adhesive may be disposed in the opening.

In some embodiments, an outer surface 352 of the optically clear adhesive in the opening may be recessed relative to the outside surface of the fabric cover 330. The amount of fill in the openings of the fabric may be substantially consistent in some embodiments, or variable in other embodiments. To control the amount of fill, during application of the optically clear adhesive, the amount of pressure applied, the amount of optically clear adhesive applied, and/or other application metrics may be modified. In some embodiments, the optically clear adhesive may not fill the openings from the inside surface to the outside surface of the fabric cover 330.

Light 322 emitted by the flexible display element 320 may impinge the optically clear adhesive layer 340 and may propagate through the optically clear adhesive layer 340 to the optically clear adhesive layer in an opening, where the light may proceed out of the fabric cover 330. As a result, less light output by the flexible display element 320 is lost to absorption, scattering, and/or other effects of traditional fabrics. As illustrated in FIG. 3, light output from the flexible display element 320 may have an angular deflection 324 of about 45 degrees, as opposed to about 20 degrees if the opening were filled with air. The limiting angle of transmission has been increased as a result of the optically clear adhesive by about double.

The amount of optically clear adhesive that is filled in openings of the fabric that forms the fabric cover 330 may vary. Examples 360 of various fill levels are illustrated in FIG. 3. For example, at a first example, the first fiber 342 and the second fiber 344 may have a first thickness 362 measured from an inside surface to an outside surface of the fabric cover 330. An amount of optically clear adhesive 370 disposed in between the first fiber 342 and the second fiber 344 may have a second thickness 372. The second thickness 372 may be less than the first thickness 362, such that a surface of the optically clear adhesive 370 is recessed relative to the outside surface of the fabric cover 330. In some embodiments, the second thickness 372 may be less than half the first thickness 362 (e.g., the first thickness 362 may be greater than half the second thickness 372, etc.).

In a second example, the first fiber 342 and the second fiber 344 may have the first thickness 362 measured from an inside surface to an outside surface of the fabric cover 330. An amount of optically clear adhesive disposed in between the first fiber 342 and the second fiber 344 may have a third thickness 374. The third thickness 374 may be less than the first thickness 362. The third thickness 374 may be greater than half the first thickness 362.

In a third example, the first fiber 342 and the second fiber 344 may have the first thickness 362 measured from an inside surface to an outside surface of the fabric cover 330. An amount of optically clear adhesive disposed in between the first fiber 342 and the second fiber 344 may have a fourth thickness 376. The fourth thickness 376 may be less than the first thickness 362. The fourth thickness 376 may be greater than two thirds the first thickness 362.

In a fourth example, the first fiber 342 and the second fiber 344 may have the first thickness 362 measured from an inside surface to an outside surface of the fabric cover 330. An amount of optically clear adhesive disposed in between the first fiber 342 and the second fiber 344 may have a fifth thickness 378. The fifth thickness 378 may be less than the first thickness 362. The fifth thickness 378 may be greater than three fourths the first thickness 362.

In a fifth example, the first fiber 342 and the second fiber 344 may have the first thickness 362 measured from an inside surface to an outside surface of the fabric cover 330. An amount of optically clear adhesive disposed in between the first fiber 342 and the second fiber 344 may have a sixth thickness 380. The sixth thickness 380 may be equal to the first thickness 362.

The optimal fill level of optically clear adhesive in openings of the fabric cover 330 may be dependent on the color of the cloth, with higher fill levels corresponding to darker colors. Additional factors may include the distance between fibers of the fabric, the thickness of fibers, wetting angle, and so forth.

Figure 4:
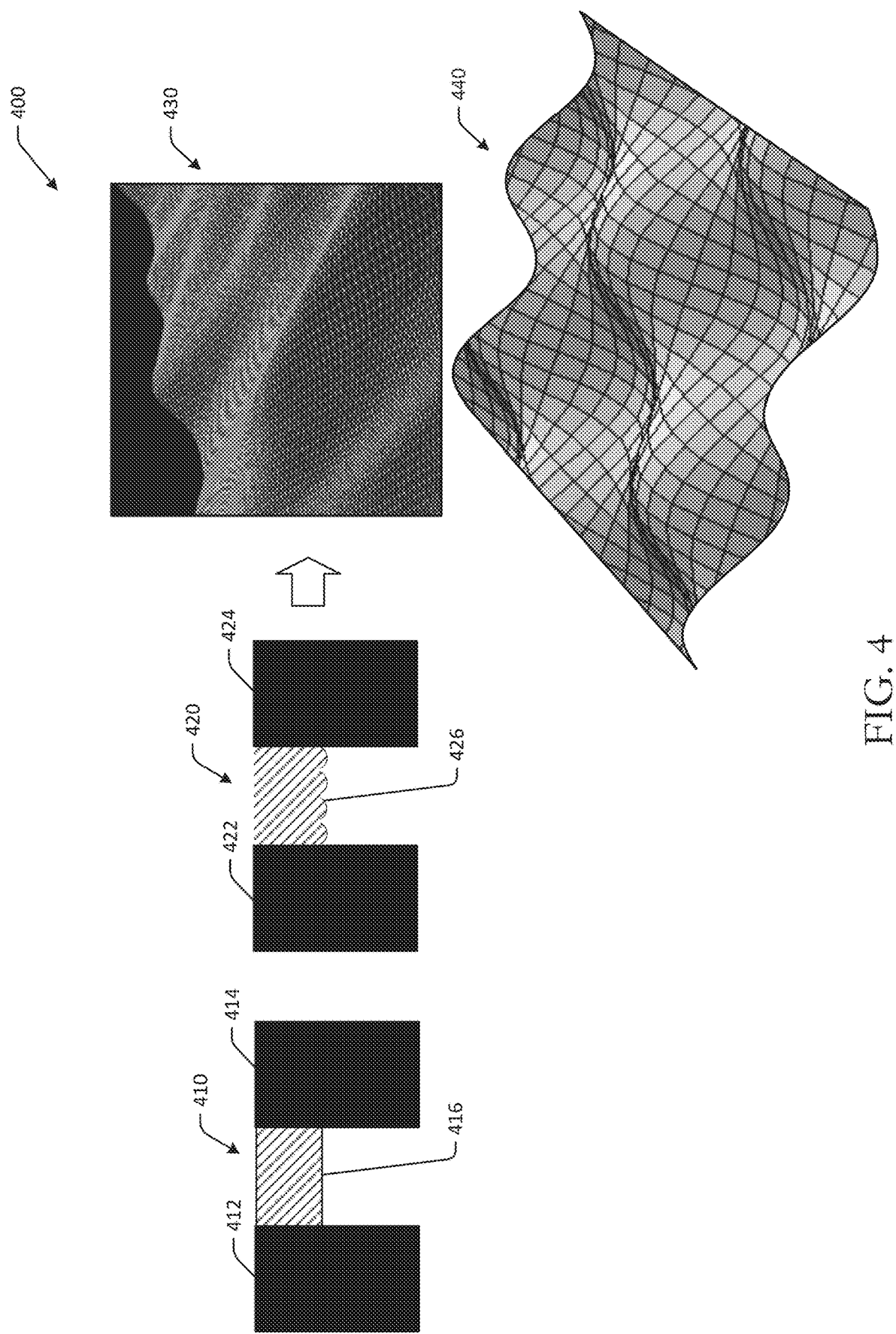
FIG. 4 is a schematic illustration of cross-sectional views of fabric covers for electronic display elements with smooth and rough surfaces in accordance with one or more embodiments of the disclosure.

FIG. 4 is a schematic illustration of cross-sectional views of covers 400 for electronic display elements with smooth and rough surfaces in accordance with one or more embodiments of the disclosure. Other embodiments may include additional or fewer components. FIG. 4 illustrates example embodiments of a fabric structure that includes openings in a certain orientation. Other embodiments may have different opening orientations, sizes, density, and/or arrangements. Although discussed in the context of fabric, other embodiments may include different types of covers, such as plastic covers (e.g., stamped plastic covers, 3D printed plastic covers, etc.), metal covers, and other types of covers. The illustration of FIG. 4 is not to scale, and may not be illustrated to scale with respect to other figures. The fabric cover illustrated in FIG. 4 may be the same fabric cover discussed with respect to the second hidden display element in FIG. 1 or the fabric covers of FIGS. 2-3.

In a first embodiment 410, a portion of optically clear adhesive may be disposed between a first fiber of fabric 412 and a second fiber of fabric 414. The portion of optically clear adhesive may have a smooth outer surface 416 (e.g., a substantially planar surface, etc.) that is recessed relative to an outer surface of the first fiber of fabric 412 and a second fiber of fabric 414. The outer surface 416 may also be recessed relative to the outer surface of the first fiber of fabric 412 and a second fiber of fabric 414.

However, in a second embodiment 420, a portion of optically clear adhesive may be disposed between a first fiber of fabric 422 and a second fiber of fabric 424. The portion of optically clear adhesive may have a rough outer surface 426 that is recessed relative to an outer surface of the first fiber of fabric 422 and a second fiber of fabric 424. The outer surface 426 may also be recessed relative to the outer surface of the first fiber of fabric 422 and a second fiber of fabric 424. The rough outer surface 426 may include one or more, or a plurality, surface features that face a viewer of the fabric cover (e.g., a display element would be positioned above the fabric cover in the cross-sectional illustration of FIG. 4, etc.). The surface features may increase light transmission through the fabric cover and may improve visibility of the light emitted by a display element. In some embodiments, the rough outer surface 426 may include specific features arranged in a certain manner, while in other embodiments, the rough outer surface 426 may include random surface features. The angle of view for the second embodiment 420 may increase to about 180 degrees in some instances. The surface features may reduce the amount of scattered light that exits the surface.

Surface features may include surface patterns and/or internal features, such as raised protrusions, directional grooves, undulations, and/or other patterns that form a roughened surface to redirect and/or scatter light. In a first embodiment 430, the rough outer surface 426 may include random peaks-and-valleys, or ridges and grooves. In a second embodiment 440, the rough outer surface 440 may include a contoured planar surface. In other embodiments, the rough outer surface may include a plurality of channels, a textured surface, a roughened surface, or other surface features.

Figure 5:
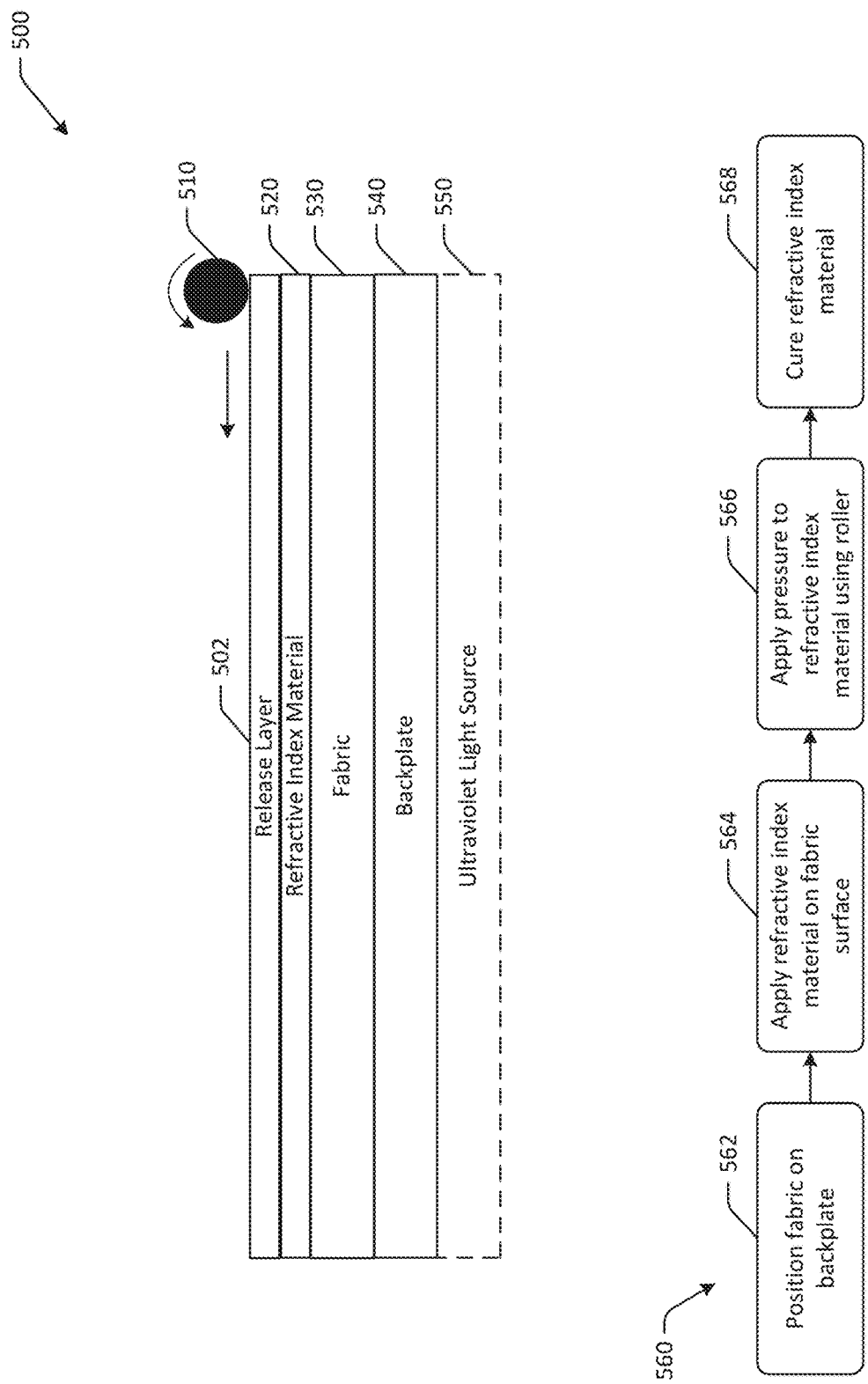
FIGS. 5-6 are schematic hybrid illustrations of various methods of manufacturing fabric cover for electronic display elements in accordance with one or more embodiments of the disclosure.
Figure 6:
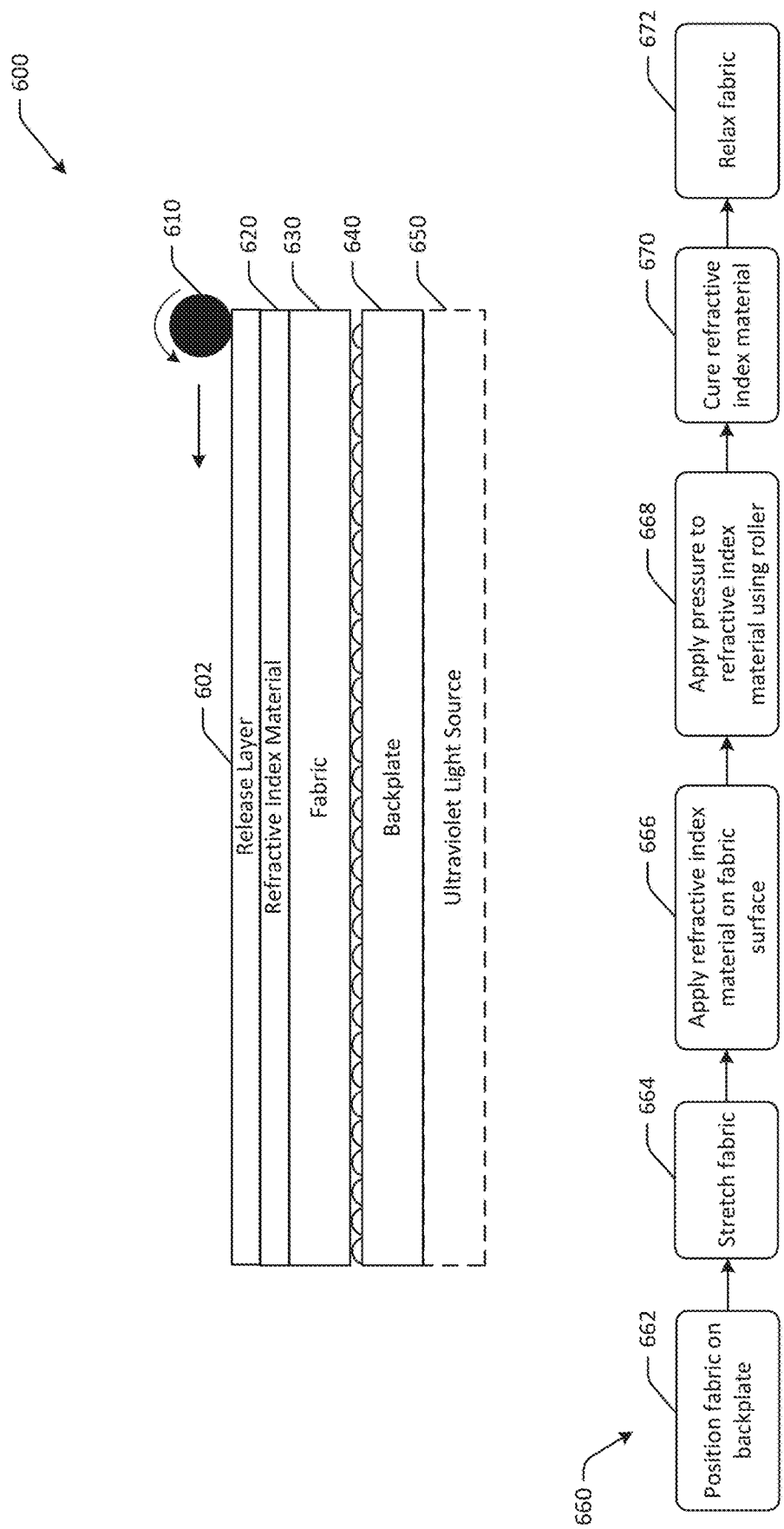

FIGS. 5-6 are schematic hybrid illustrations of various methods of manufacturing covers for electronic display elements in accordance with one or more embodiments of the disclosure. FIG. 5 depicts an example process of forming fabric covers with refractive index material having substantially smooth surfaces, and FIG. 6 depicts an example process of forming fabric covers with refractive index material having rough surfaces. Although discussed in the context of fabric, other embodiments may include different types of covers, such as plastic covers (e.g., stamped plastic covers, 3D printed plastic covers, etc.), metal covers, and other types of covers.

In FIG. 5, an example use case 500 of forming a fabric cover with improved visibility is depicted. An example forming system may include a pressure application device 510, a refractive index material 520, a fabric 530, a backplate 540, and an optional ultraviolet light source 550. The pressure application device 510 may be, for example, a lamination roller or other device. The refractive index material 520 may be a liquid optically clear adhesive, a transparent polymer material, a form of plastic, an antiglare coating, or another material that has a refractive index value of between about 1.3 and about 1.7, such as about 1.5. The backplate 540 may be clear and may provide a smooth surface for the fabric 520. The optional ultraviolet light source 550 may be any suitable source of ultraviolet light that is directed towards the fabric 530. In some embodiments, the ultraviolet light source 550 may be a separate device. An optional release layer 502, such as a thin plastic substrate or other material, may be disposed between the pressure application device 510 and the refractive index material 520 to prevent sticking between the pressure application device 510 and the refractive index material 520.

To form fabric covers with improved visibility, an example process flow 560 may be implemented using the elements depicted in FIG. 5. At a first block 562, the fabric 530 may be positioned on the backplate 540. In some instances, the fabric 530 may be secured to the backplate 540, whereas in other instances, the fabric 530 may not be secured to the backplate 540. In some embodiments, the fabric 530 may be stretched in a lateral direction when secured to the backplate 540.

At a second block 564, the refractive index material 520 may be applied on a fabric surface. For example, the refractive index material 520 may be sprayed, coated, rolled, or otherwise applied on a surface of the fabric 530. The refractive index material 520 may be applied at a certain volume or may have a certain predetermined thickness during application.

At a third block 566, pressure may be applied to the refractive index material. For example, using the pressure application device 510, which may be a roller, pressure may be applied to the refractive index material 520. The amount of pressure applied by the pressure application device 510, the speed and/or direction of rotation of the pressure application device 510, and the vertical motion of the pressure application device 510 may be varied to achieve a desired fill level of openings in the fabric 530 with the refractive index material 520. For example, increased pressure may result in increased fill levels. In some embodiments, leakage of the refractive index material 520 to the "lower" side of the fabric 530 may be prevented.

At a fourth block 568, the refractive index material may be cured. For example, the refractive index material 520 may be an optically clear adhesive that is cured with ultraviolet light. Accordingly, the system may optionally include the ultraviolet light source 550, which can be used to cure the refractive index material 520. In some embodiments, the backplate 540 may be clear to facilitate curing of the refractive index material 520. In some instances, the refractive index material 520 may be configured to shrink during curing. As a result, even if refractive index material 520 reaches the "lower" side of the fabric 530, shrinkage that occurs during or after curing may cause the refractive index material 520 in openings of the fabric 530 to recess with respect to the "lower" surface of the fabric 530. In some embodiments, the fabric 530 may be removed from the backplate 540 prior to curing, so as to prevent sticking between the fabric 530 and backplate 540.

In FIG. 6, an example use case 600 of forming a fabric cover with improved visibility is depicted. An example forming system may include a pressure application device 610, a refractive index material 620, a fabric 630, a backplate 640, and an optional ultraviolet light source 650. The pressure application device 610 may be, for example, a lamination roller or other device. The refractive index material 620 may be a liquid optically clear adhesive, a transparent polymer material, an anti-glare coating, a form of plastic, or another material that has a refractive index value of between about 1.3 and about 1.7, such as about 1.5. The backplate 640 may be clear and may provide a rough surface for the fabric 620. For example, as illustrated in FIG. 6, the backplate 640 may have a bumpy surface that contacts the fabric 630. In some embodiments, the backplate 640 may have ridges, grooves, channels, bumps, or other protrusions that extend from the surface that contacts the fabric 630. The protrusions may limit the amount of refractive index material 620 that fills openings in the fabric 630. The optional ultraviolet light source 650 may be any suitable source of ultraviolet light that is directed towards the fabric 630. In some embodiments, the ultraviolet light source 650 may be a separate device. An optional release layer 602, such as a thin plastic substrate or other material, may be disposed between the pressure application device 610 and the refractive index material 620 to prevent sticking between the pressure application device 610 and the refractive index material 620.

To form fabric covers with improved visibility, an example process flow 660 may be implemented using the elements depicted in FIG. 6. At a first block 662, the fabric 630 may be positioned on the backplate 640. In some instances, the fabric 630 may be secured to the backplate 640, whereas in other instances, the fabric 630 may not be secured to the backplate 640. In some embodiments, the fabric 630 may be stretched in a lateral direction when secured to the backplate 640.

At a second block 664, the fabric may be stretched. For example, the fabric 630 may be stretched in one or more directions while it is secured to the backplate 640 and/or by another device. Stretching the fabric 630 may reduce a thickness of the fabric 630, which may result in a fill level being reduced when the fabric 630 is released. For example, after the fabric 630 is released, the thickness of the fabric 630 may increase, which may reduce a fill level of the refractive index material 620 relative to the thickness of the fabric 630.

At a third block 666, the refractive index material 620 may be applied on a fabric surface. For example, the refractive index material 620 may be sprayed, coated, rolled, or otherwise applied on a surface of the fabric 630. The refractive index material 620 may be applied at a certain volume or may have a certain predetermined thickness during application.

At a fourth block 668, pressure may be applied to the refractive index material. For example, using the pressure application device 610, which may be a roller, pressure may be applied to the refractive index material 620. The amount of pressure applied by the pressure application device 610, the speed and/or direction of rotation of the pressure application device 610, and the vertical motion of the pressure application device 610 may be varied to achieve a desired fill level of openings in the fabric 630 with the refractive index material 620. For example, increased pressure may result in increased fill levels. In some embodiments, leakage of the refractive index material 620 to the "lower" side of the fabric 630 may be prevented.

At a fifth block 670, the refractive index material may be cured. For example, the refractive index material 620 may be an optically clear adhesive that is cured with ultraviolet light. Accordingly, the system may optionally include the ultraviolet light source 650, which can be used to cure the refractive index material 620. In some embodiments, the backplate 640 may be clear to facilitate curing of the refractive index material 620. In some instances, the refractive index material 620 may be configured to shrink during curing. As a result, even if refractive index material 620 reaches the "lower" side of the fabric 630, shrinkage that occurs during or after curing may cause the refractive index material 520 in openings of the fabric 630 to recess with respect to the "lower" surface of the fabric 630. In some embodiments, the fabric 630 may be removed from the backplate 640 prior to curing, so as to prevent sticking between the fabric 630 and backplate 640.

At a sixth block 672, the fabric may be relaxed. For example, the fabric 630 may be unsecured and/or otherwise released from the stretched position, and the cured refractive index material 620 may remain at its thickness, while the thickness of the fabric 630 increases to its original thickness. As a result, the fill level of the refractive index material 620 in openings of the fabric 630 may be reduced. In some embodiments, the fabric 630 may be relaxed prior to curing.

Due to the surface features of the backplate 640, the cured refractive index material 620 may have a rough surface, such as a surface with bumps, channels, grooves, and the like. As a result, light exiting through the refractive index material 620 may be scattered, thereby increasing viewing angles, visibility, contrast, and/or brightness of a display element positioned adjacent to the fabric 630. In some embodiments, an anti-glare coating may be applied to or otherwise disposed on the rough surface of the refractive index material 620 to reduce glare after the refractive index material 620 is cured.

One or more operations of the methods, process flows, or use cases of FIGS. 1-6 may have been described above as being performed by a user device, or more specifically, by one or more program module(s), applications, or the like executing on a device. It should be appreciated, however, that any of the operations of the methods, process flows, or use cases of FIGS. 1-6 may be performed, at least in part, in a distributed manner by one or more other devices, or more specifically, by one or more program module(s), applications, or the like executing on such devices. In addition, it should be appreciated that processing performed in response to the execution of computer-executable instructions provided as part of an application, program module, or the like may be interchangeably described herein as being performed by the application or the program module itself or by a device on which the application, program module, or the like is executing. While the operations of the methods, process flows, or use cases of FIGS. 1-6 may be described in the context of the illustrative devices, it should be appreciated that such operations may be implemented in connection with numerous other device configurations.

The operations described and depicted in the illustrative methods, process flows, and use cases of FIGS. 1-6 may be carried out or performed in any suitable order, such as the depicted orders, as desired in various example embodiments of the disclosure. Additionally, in certain example embodiments, at least a portion of the operations may be carried out in parallel. Furthermore, in certain example embodiments, less, more, or different operations than those depicted in FIGS. 1-6 may be performed.

Although specific embodiments of the disclosure have been described, one of ordinary skill in the art will recognize that numerous other modifications and alternative embodiments are within the scope of the disclosure. For example, any of the functionality and/or processing capabilities described with respect to a particular device or component may be performed by any other device or component. Further, while various illustrative implementations and architectures have been described in accordance with embodiments of the disclosure, one of ordinary skill in the art will appreciate that numerous other modifications to the illustrative implementations and architectures described herein are also within the scope of this disclosure.

Certain aspects of the disclosure are described above with reference to block and flow diagrams of systems, methods, apparatuses, and/or computer program products according to example embodiments. It will be understood that one or more blocks of the block diagrams and flow diagrams, and combinations of blocks in the block diagrams and the flow diagrams, respectively, may be implemented by the execution of computer-executable program instructions. Likewise, some blocks of the block diagrams and flow diagrams may not necessarily need to be performed in the order presented, or may not necessarily need to be performed at all, according to some embodiments. Further, additional components and/or operations beyond those depicted in blocks of the block and/or flow diagrams may be present in certain embodiments.

Accordingly, blocks of the block diagrams and flow diagrams support combinations of means for performing the specified functions, combinations of elements or steps for performing the specified functions, and program instruction means for performing the specified functions. It will also be understood that each block of the block diagrams and flow diagrams, and combinations of blocks in the block diagrams and flow diagrams, may be implemented by special-purpose, hardware-based computer systems that perform the specified functions, elements or steps, or combinations of special-purpose hardware and computer instructions.

Illustrative Computer Architecture

Figure 7:
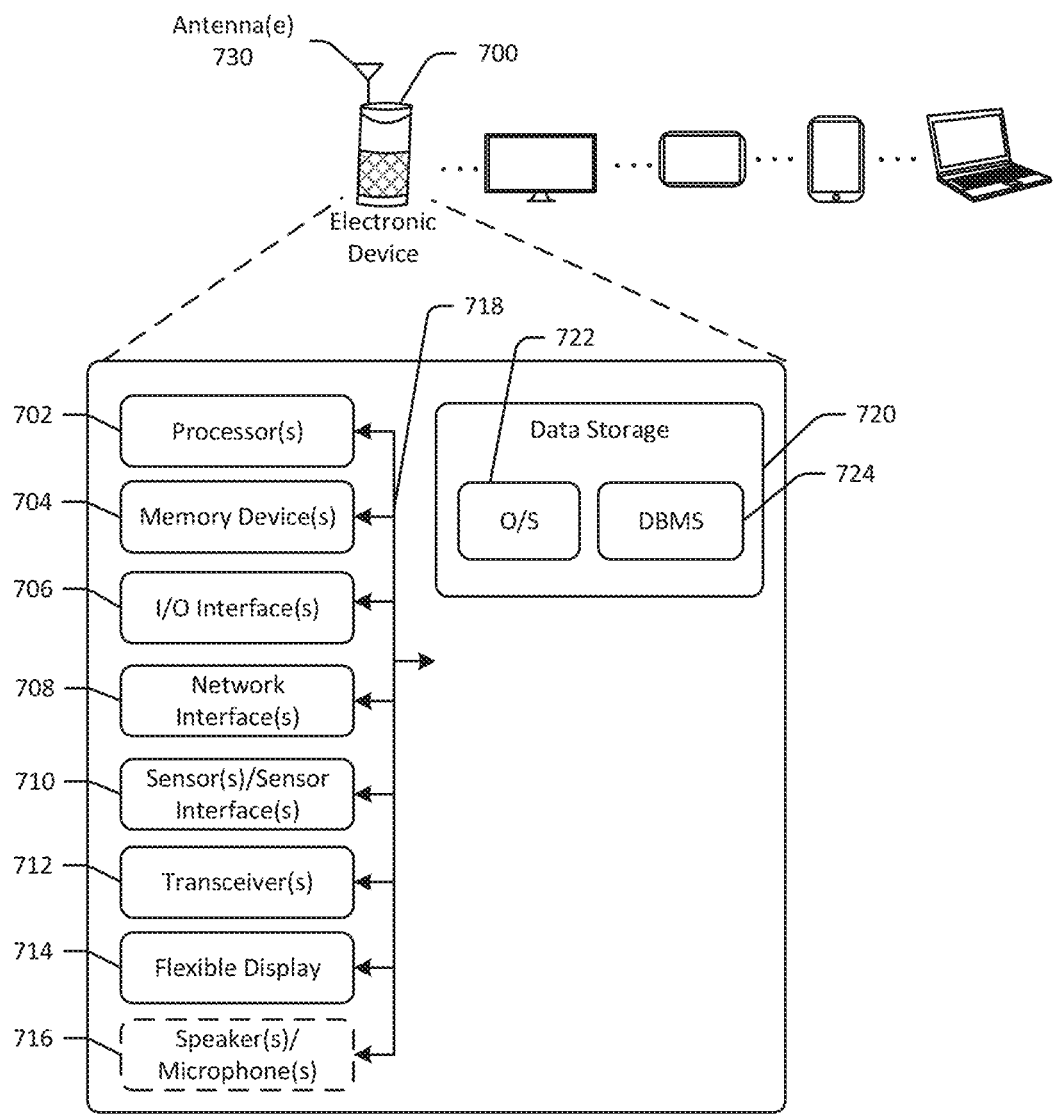
FIG. 7 schematically illustrates an example architecture of an electronic device in accordance with one or more embodiments of the disclosure.

FIG. 7 is a schematic block diagram of one or more illustrative electronic device(s) 700 in accordance with one or more example embodiments of the disclosure. The electronic device(s) 700 may include any suitable computing device including, but not limited to, a server system, a voice interaction device, a mobile device such as a smartphone, a tablet, an e-reader, a wearable device, or the like; a desktop computer; a laptop computer; a content streaming device; or the like. The electronic device(s) 700 may correspond to an illustrative device configuration for the device(s) of FIGS. 1-6.

The electronic device(s) 700 may be configured to communicate with one or more servers, user devices, or the like. The electronic device(s) 700 may be configured to render digital content and/or present information using an electronic display element.

The electronic device(s) 700 may be configured to communicate via one or more networks. Such network(s) may include, but are not limited to, any one or more different types of communications networks such as, for example, cable networks, public networks (e.g., the Internet), private networks (e.g., frame-relay networks), wireless networks, cellular networks, telephone networks (e.g., a public switched telephone network), or any other suitable private or public packet-switched or circuit-switched networks. Further, such network(s) may have any suitable communication range associated therewith and may include, for example, global networks (e.g., the Internet), metropolitan area networks (MANs), wide area networks (WANs), local area networks (LANs), or personal area networks (PANs). In addition, such network(s) may include communication links and associated networking devices (e.g., link-layer switches, routers, etc.) for transmitting network traffic over any suitable type of medium including, but not limited to, coaxial cable, twisted-pair wire (e.g., twisted-pair copper wire), optical fiber, a hybrid fiber-coaxial (HFC) medium, a microwave medium, a radio frequency communication medium, a satellite communication medium, or any combination thereof.

In an illustrative configuration, the electronic device(s) 700 may include one or more processors (processor(s)) 702, one or more memory devices 704 (also referred to herein as memory 704), one or more input/output (I/O) interface(s) 706, one or more network interface(s) 708, one or more sensor(s) or sensor interface(s) 710, one or more transceiver(s) 712, one or more (optionally flexible) display(s) or display element(s) 714, one or more optional microphone(s) 716, and data storage 720. The electronic device(s) 700 may further include one or more bus(es) 718 that functionally couple various components of the electronic device(s) 700. The electronic device(s) 700 may further include one or more antenna(e) 730 that may include, without limitation, a cellular antenna for transmitting or receiving signals to/from a cellular network infrastructure, an antenna for transmitting or receiving Wi-Fi signals to/from an access point (AP), a Global Navigation Satellite System (GNSS) antenna for receiving GNSS signals from a GNSS satellite, a Bluetooth antenna for transmitting or receiving Bluetooth signals, a Near Field Communication (NFC) antenna for transmitting or receiving NFC signals, and so forth. These various components will be described in more detail hereinafter.

The bus(es) 718 may include at least one of a system bus, a memory bus, an address bus, or a message bus, and may permit the exchange of information (e.g., data (including computer-executable code), signaling, etc.) between various components of the electronic device(s) 700. The bus(es) 718 may include, without limitation, a memory bus or a memory controller, a peripheral bus, an accelerated graphics port, and so forth. The bus(es) 718 may be associated with any suitable bus architecture including, without limitation, an Industry Standard Architecture (ISA), a Micro Channel Architecture (MCA), an Enhanced ISA (EISA), a Video Electronics Standards Association (VESA) architecture, an Accelerated Graphics Port (AGP) architecture, a Peripheral Component Interconnect (PCI) architecture, a PCI-Express architecture, a Personal Computer Memory Card International Association (PCMCIA) architecture, a Universal Serial Bus (USB) architecture, and so forth.

The memory 704 of the electronic device(s) 700 may include volatile memory (memory that maintains its state when supplied with power) such as random access memory (RAM) and/or non-volatile memory (memory that maintains its state even when not supplied with power) such as read-only memory (ROM), flash memory, ferroelectric RAM (FRAM), and so forth. Persistent data storage, as that term is used herein, may include non-volatile memory. In certain example embodiments, volatile memory may enable faster read/write access than non-volatile memory. However, in certain other example embodiments, certain types of non-volatile memory (e.g., FRAM) may enable faster read/write access than certain types of volatile memory.

In various implementations, the memory 704 may include multiple different types of memory such as various types of static random access memory (SRAM), various types of dynamic random access memory (DRAM), various types of unalterable ROM, and/or writeable variants of ROM such as electrically erasable programmable read-only memory (EEPROM), flash memory, and so forth. The memory 704 may include main memory as well as various forms of cache memory such as instruction cache(s), data cache(s), translation lookaside buffer(s) (TLBs), and so forth. Further, cache memory such as a data cache may be a multi-level cache organized as a hierarchy of one or more cache levels (L1, L2, etc.).

The data storage 720 may include removable storage and/or non-removable storage including, but not limited to, magnetic storage, optical disk storage, and/or tape storage. The data storage 720 may provide non-volatile storage of computer-executable instructions and other data. The memory 704 and the data storage 720, removable and/or non-removable, are examples of computer-readable storage media (CRSM) as that term is used herein.

The data storage 720 may store computer-executable code, instructions, or the like that may be loadable into the memory 704 and executable by the processor(s) 702 to cause the processor(s) 702 to perform or initiate various operations. The data storage 720 may additionally store data that may be copied to the memory 704 for use by the processor(s) 702 during the execution of the computer-executable instructions. Moreover, output data generated as a result of execution of the computer-executable instructions by the processor(s) 702 may be stored initially in the memory 704, and may ultimately be copied to the data storage 720 for non-volatile storage.

More specifically, the data storage 720 may store one or more operating systems (O/S) 722; one or more database management systems (DBMS) 724; and one or more program module(s), applications, engines, computer-executable code, scripts, or the like. Some or all of these module(s) may be sub-module(s). Any of the components depicted as being stored in the data storage 720 may include any combination of software, firmware, and/or hardware. The software and/or firmware may include computer-executable code, instructions, or the like that may be loaded into the memory 704 for execution by one or more of the processor(s) 702. Any of the components depicted as being stored in the data storage 720 may support functionality described in reference to corresponding components named earlier in this disclosure.

The data storage 720 may further store various types of data utilized by the components of the electronic device(s) 700. Any data stored in the data storage 720 may be loaded into the memory 704 for use by the processor(s) 702 in executing computer-executable code. In addition, any data depicted as being stored in the data storage 720 may potentially be stored in one or more datastore(s) and may be accessed via the DBMS 724 and loaded in the memory 704 for use by the processor(s) 702 in executing computer-executable code. The datastore(s) may include, but are not limited to, databases (e.g., relational, object-oriented, etc.), file systems, flat files, distributed datastores in which data is stored on more than one node of a computer network, peer-to-peer network datastores, or the like.

The processor(s) 702 may be configured to access the memory 704 and execute the computer-executable instructions loaded therein. For example, the processor(s) 702 may be configured to execute the computer-executable instructions of the various program module(s), applications, engines, or the like of the electronic device(s) 700 to cause or facilitate various operations to be performed in accordance with one or more embodiments of the disclosure. The processor(s) 702 may include any suitable processing unit capable of accepting data as input, processing the input data in accordance with stored computer-executable instructions, and generating output data. The processor(s) 702 may include any type of suitable processing unit including, but not limited to, a central processing unit, a microprocessor, a Reduced Instruction Set Computer (RISC) microprocessor, a Complex Instruction Set Computer (CISC) microprocessor, a microcontroller, an Application Specific Integrated Circuit (ASIC), a Field-Programmable Gate Array (FPGA), a System-on-a-Chip (SoC), a digital signal processor (DSP), and so forth. Further, the processor(s) 702 may have any suitable microarchitecture design that includes any number of constituent components such as, for example, registers, multiplexers, arithmetic logic units, cache controllers for controlling read/write operations to cache memory, branch predictors, or the like. The microarchitecture design of the processor(s) 702 may be capable of supporting any of a variety of instruction sets.

Referring now to other illustrative components depicted as being stored in the data storage 720, the O/S 722 may be loaded from the data storage 720 into the memory 704 and may provide an interface between other application software executing on the electronic device(s) 700 and the hardware resources of the electronic device(s) 700. More specifically, the O/S 722 may include a set of computer-executable instructions for managing the hardware resources of the electronic device(s) 700 and for providing common services to other application programs (e.g., managing memory allocation among various application programs). In certain example embodiments, the O/S 722 may control execution of the other program module(s). The O/S 722 may include any operating system now known or which may be developed in the future including, but not limited to, any server operating system, any mainframe operating system, or any other proprietary or non-proprietary operating system.

The DBMS 724 may be loaded into the memory 704 and may support functionality for accessing, retrieving, storing, and/or manipulating data stored in the memory 704 and/or data stored in the data storage 720. The DBMS 724 may use any of a variety of database models (e.g., relational model, object model, etc.) and may support any of a variety of query languages. The DBMS 724 may access data represented in one or more data schemas and stored in any suitable data repository including, but not limited to, databases (e.g., relational, object-oriented, etc.), file systems, flat files, distributed datastores in which data is stored on more than one node of a computer network, peer-to-peer network datastores, or the like. In those example embodiments in which the electronic device(s) 700 is a mobile device, the DBMS 724 may be any suitable lightweight DBMS optimized for performance on a mobile device.

Referring now to other illustrative components of the electronic device(s) 700, the input/output (I/O) interface(s) 706 may facilitate the receipt of input information by the electronic device(s) 700 from one or more I/O devices as well as the output of information from the electronic device(s) 700 to the one or more I/O devices. The I/O devices may include any of a variety of components such as a display or display screen having a touch surface or touchscreen; an audio output device for producing sound, such as a speaker; an audio capture device, such as a microphone; an image and/or video capture device, such as a camera; a haptic unit; and so forth. Any of these components may be integrated into the electronic device(s) 700 or may be separate. The I/O devices may further include, for example, any number of peripheral devices such as data storage devices, printing devices, and so forth.

The I/O interface(s) 706 may also include an interface for an external peripheral device connection such as universal serial bus (USB), FireWire, Thunderbolt, Ethernet port or other connection protocol that may connect to one or more networks. The I/O interface(s) 706 may also include a connection to one or more of the antenna(e) 730 to connect to one or more networks via a wireless local area network (WLAN) (such as Wi-Fi) radio, Bluetooth, ZigBee, and/or a wireless network radio, such as a radio capable of communication with a wireless communication network such as a Long Term Evolution (LTE) network, WiMAX network, 3G network, a ZigBee network, etc.

The electronic device(s) 700 may further include one or more network interface(s) 708 via which the electronic device(s) 700 may communicate with any of a variety of other systems, platforms, networks, devices, and so forth. The network interface(s) 708 may enable communication, for example, with one or more wireless routers, one or more host servers, one or more web servers, and the like via one or more networks.

The antenna(e) 730 may include any suitable type of antenna depending, for example, on the communications protocols used to transmit or receive signals via the antenna(e) 730. Non-limiting examples of suitable antennae may include directional antennae, non-directional antennae, dipole antennae, folded dipole antennae, patch antennae, multiple-input multiple-output (MIMO) antennae, or the like. The antenna(e) 730 may be communicatively coupled to one or more transceivers 712 or radio components to which or from which signals may be transmitted or received.

As previously described, the antenna(e) 730 may include a cellular antenna configured to transmit or receive signals in accordance with established standards and protocols, such as Global System for Mobile Communications (GSM), 3G standards (e.g., Universal Mobile Telecommunications System (UMTS), Wideband Code Division Multiple Access (W-CDMA), CDMA2000, etc.), 4G standards (e.g., Long-Term Evolution (LTE), WiMax, etc.), direct satellite communications, or the like.

The antenna(e) 730 may additionally, or alternatively, include a Wi-Fi antenna configured to transmit or receive signals in accordance with established standards and protocols, such as the IEEE 802.11 family of standards, including via 2.4 GHz channels (e.g., 802.11b, 802.11g, 802.11n), 5 GHz channels (e.g., 802.11n, 802.11ac), or 60 GHz channels (e.g., 802.11ad). In alternative example embodiments, the antenna(e) 730 may be configured to transmit or receive radio frequency signals within any suitable frequency range forming part of the unlicensed portion of the radio spectrum.

The antenna(e) 730 may additionally, or alternatively, include a GNSS antenna configured to receive GNSS signals from three or more GNSS satellites carrying time-position information to triangulate a position therefrom. Such a GNSS antenna may be configured to receive GNSS signals from any current or planned GNSS such as, for example, the Global Positioning System (GPS), the GLONASS System, the Compass Navigation System, the Galileo System, or the Indian Regional Navigational System.

The transceiver(s) 712 may include any suitable radio component(s) for—in cooperation with the antenna(e) 730—transmitting or receiving radio frequency (RF) signals in the bandwidth and/or channels corresponding to the communications protocols utilized by the electronic device(s) 700 to communicate with other devices. The transceiver(s) 712 may include hardware, software, and/or firmware for modulating, transmitting, or receiving—potentially in cooperation with any of antenna(e) 730—communications signals according to any of the communications protocols discussed above including, but not limited to, one or more Wi-Fi and/or Wi-Fi direct protocols, as standardized by the IEEE 802.11 standards, one or more non-Wi-Fi protocols, or one or more cellular communications protocols or standards. The transceiver(s) 712 may further include hardware, firmware, or software for receiving GNSS signals. The transceiver(s) 712 may include any known receiver and baseband suitable for communicating via the communications protocols utilized by the electronic device(s) 700. The transceiver(s) 712 may further include a low noise amplifier (LNA), additional signal amplifiers, an analog-to-digital (A/D) converter, one or more buffers, a digital baseband, or the like.

The sensor(s)/sensor interface(s) 710 may include or may be capable of interfacing with any suitable type of sensing device such as, for example, inertial sensors, force sensors, thermal sensors, photocells, and so forth. Example types of inertial sensors may include accelerometers (e.g., MEMS-based accelerometers), gyroscopes, and so forth.

The display(s) 714 may be flexible, and may be configured to output light and/or render content. The display(s) 714 may be optionally covered with a fabric with refractive index material disposed in one or more openings formed by fibers of the fabric, such as those described in conjunction with FIGS. 1-6. The optional speaker(s)/microphone(s) 716 may be any device configured to receive analog sound input or voice data.

It should be appreciated that the program module(s), applications, computer-executable instructions, code, or the like depicted in FIG. 7 as being stored in the data storage 720 are merely illustrative and not exhaustive and that processing described as being supported by any particular module may alternatively be distributed across multiple module(s) or performed by a different module. In addition, various program module(s), script(s), plug-in(s), Application Programming Interface(s) (API(s)), or any other suitable computer-executable code hosted locally on the electronic device(s) 700, and/or hosted on other computing device(s) accessible via one or more networks, may be provided to support functionality provided by the program module(s), applications, or computer-executable code depicted in FIG. 7 and/or additional or alternate functionality. Further, functionality may be modularized differently such that processing described as being supported collectively by the collection of program module(s) depicted in FIG. 7 may be performed by a fewer or greater number of module(s), or functionality described as being supported by any particular module may be supported, at least in part, by another module. In addition, program module(s) that support the functionality described herein may form part of one or more applications executable across any number of systems or devices in accordance with any suitable computing model such as, for example, a client-server model, a peer-to-peer model, and so forth. In addition, any of the functionality described as being supported by any of the program module(s) depicted in FIG. 7 may be implemented, at least partially, in hardware and/or firmware across any number of devices.

It should further be appreciated that the electronic device(s) 700 may include alternate and/or additional hardware, software, or firmware components beyond those described or depicted without departing from the scope of the disclosure. More particularly, it should be appreciated that software, firmware, or hardware components depicted as forming part of the electronic device(s) 700 are merely illustrative and that some components may not be present or additional components may be provided in various embodiments. While various illustrative program module(s) have been depicted and described as software module(s) stored in the data storage 720, it should be appreciated that functionality described as being supported by the program module(s) may be enabled by any combination of hardware, software, and/or firmware. It should further be appreciated that each of the above-mentioned module(s) may, in various embodiments, represent a logical partitioning of supported functionality. This logical partitioning is depicted for ease of explanation of the functionality and may not be representative of the structure of software, hardware, and/or firmware for implementing the functionality. Accordingly, it should be appreciated that functionality described as being provided by a particular module may, in various embodiments, be provided at least in part by one or more other module(s). Further, one or more depicted module(s) may not be present in certain embodiments, while in other embodiments, additional module(s) not depicted may be present and may support at least a portion of the described functionality and/or additional functionality. Moreover, while certain module(s) may be depicted and described as sub-module(s) of another module, in certain embodiments, such module(s) may be provided as independent module(s) or as sub-module(s) of other module(s).

One or more operations of the methods, process flows, and use cases of FIGS. 1-6 may be performed by a device having the illustrative configuration depicted in FIG. 7, or more specifically, by one or more engines, program module(s), applications, or the like executable on such a device. It should be appreciated, however, that such operations may be implemented in connection with numerous other device configurations.

The operations described and depicted in the illustrative methods and process flows of any of FIGS. 1-6 may be carried out or performed in any suitable order as desired in various example embodiments of the disclosure. Additionally, in certain example embodiments, at least a portion of the operations may be carried out in parallel. Furthermore, in certain example embodiments, less, more, or different operations than those depicted in FIGS. 1-6 may be performed.

Although specific embodiments of the disclosure have been described, one of ordinary skill in the art will recognize that numerous other modifications and alternative embodiments are within the scope of the disclosure. For example, any of the functionality and/or processing capabilities described with respect to a particular device or component may be performed by any other device or component. Further, while various illustrative implementations and architectures have been described in accordance with embodiments of the disclosure, one of ordinary skill in the art will appreciate that numerous other modifications to the illustrative implementations and architectures described herein are also within the scope of this disclosure.

Certain aspects of the disclosure are described above with reference to block and flow diagrams of systems, methods, apparatuses, and/or computer program products according to example embodiments. It will be understood that one or more blocks of the block diagrams and flow diagrams, and combinations of blocks in the block diagrams and the flow diagrams, respectively, may be implemented by execution of computer-executable program instructions. Likewise, some blocks of the block diagrams and flow diagrams may not necessarily need to be performed in the order presented, or may not necessarily need to be performed at all, according to some embodiments. Further, additional components and/or operations beyond those depicted in blocks of the block and/or flow diagrams may be present in certain embodiments.

Accordingly, blocks of the block diagrams and flow diagrams support combinations of means for performing the specified functions, combinations of elements or steps for performing the specified functions, and program instruction means for performing the specified functions. It will also be understood that each block of the block diagrams and flow diagrams, and combinations of blocks in the block diagrams and flow diagrams, may be implemented by special-purpose, hardware-based computer systems that perform the specified functions, elements or steps, or combinations of special-purpose hardware and computer instructions.

Program module(s), applications, or the like disclosed herein may include one or more software components including, for example, software objects, methods, data structures, or the like. Each such software component may include computer-executable instructions that, responsive to execution, cause at least a portion of the functionality described herein (e.g., one or more operations of the illustrative methods described herein) to be performed.

A software component may be coded in any of a variety of programming languages. An illustrative programming language may be a lower-level programming language such as an assembly language associated with a particular hardware architecture and/or operating system platform. A software component comprising assembly language instructions may require conversion into executable machine code by an assembler prior to execution by the hardware architecture and/or platform.

Another example programming language may be a higher-level programming language that may be portable across multiple architectures. A software component comprising higher-level programming language instructions may require conversion to an intermediate representation by an interpreter or a compiler prior to execution.

Other examples of programming languages include, but are not limited to, a macro language, a shell or command language, a job control language, a script language, a database query or search language, or a report writing language. In one or more example embodiments, a software component comprising instructions in one of the foregoing examples of programming languages may be executed directly by an operating system or other software component without having to be first transformed into another form.

A software component may be stored as a file or other data storage construct. Software components of a similar type or functionally related may be stored together such as, for example, in a particular directory, folder, or library. Software components may be static (e.g., pre-established or fixed) or dynamic (e.g., created or modified at the time of execution).

Software components may invoke or be invoked by other software components through any of a wide variety of mechanisms. Invoked or invoking software components may comprise other custom-developed application software, operating system functionality (e.g., device drivers, data storage (e.g., file management) routines, other common routines and services, etc.), or third-party software components (e.g., middleware, encryption, or other security software, database management software, file transfer or other network communication software, mathematical or statistical software, image processing software, and format translation software).

Software components associated with a particular solution or system may reside and be executed on a single platform or may be distributed across multiple platforms. The multiple platforms may be associated with more than one hardware vendor, underlying chip technology, or operating system. Furthermore, software components associated with a particular solution or system may be initially written in one or more programming languages, but may invoke software components written in another programming language.

Computer-executable program instructions may be loaded onto a special-purpose computer or other particular machine, a processor, or other programmable data processing apparatus to produce a particular machine, such that execution of the instructions on the computer, processor, or other programmable data processing apparatus causes one or more functions or operations specified in the flow diagrams to be performed. These computer program instructions may also be stored in a computer-readable storage medium (CRSM) that upon execution may direct a computer or other programmable data processing apparatus to function in a particular manner, such that the instructions stored in the computer-readable storage medium produce an article of manufacture including instruction means that implement one or more functions or operations specified in the flow diagrams. The computer program instructions may also be loaded onto a computer or other programmable data processing apparatus to cause a series of operational elements or steps to be performed on the computer or other programmable apparatus to produce a computer-implemented process.

Additional types of CRSM that may be present in any of the devices described herein may include, but are not limited to, programmable random access memory (PRAM), SRAM, DRAM, RAM, ROM, electrically erasable programmable read-only memory (EEPROM), flash memory or other memory technology, compact disc read-only memory (CD-ROM), digital versatile disc (DVD) or other optical storage, magnetic cassettes, magnetic tape, magnetic disk storage or other magnetic storage devices, or any other medium which can be used to store the information and which can be accessed. Combinations of any of the above are also included within the scope of CRSM. Alternatively, computer-readable communication media (CRCM) may include computer-readable instructions, program module(s), or other data transmitted within a data signal, such as a carrier wave, or other transmission. However, as used herein, CRSM does not include CRCM.

Although embodiments have been described in language specific to structural features and/or methodological acts, it is to be understood that the disclosure is not necessarily limited to the specific features or acts described. Rather, the specific features and acts are disclosed as illustrative forms of implementing the embodiments. Conditional language, such as, among others, "can," "could," "might," or "may," unless specifically stated otherwise, or otherwise understood within the context as used, is generally intended to convey that certain embodiments could include, while other embodiments do not include, certain features, elements, and/or steps. Thus, such conditional language is not generally intended to imply that features, elements, and/or steps are in any way required for one or more embodiments or that one or more embodiments necessarily include logic for deciding, with or without user input or prompting, whether these features, elements, and/or steps are included or are to be performed in any particular embodiment.

That which is claimed is:

1. An electronic device comprising:
a cylindrical housing;
a display element disposed about the cylindrical housing; and
a woven fabric cover disposed about the display element, the woven fabric cover having an inside surface that faces the display element, and an outside surface that faces outward with respect to the cylindrical housing, wherein the woven fabric cover comprises:
a first yarn segment;
a second yarn segment coupled to the first yarn segment, wherein the first yarn segment and the second yarn segment together form an opening that extends through the woven fabric cover; and
an optically clear adhesive disposed on the first yarn segment and the second yarn segment, wherein a first portion of the optically clear adhesive is disposed on the inside surface of the woven fabric cover, and a second portion of the optically clear adhesive fills the opening, wherein the optically clear adhesive has a refractive index value of about 1.5;
wherein light output by the display element is visible through the woven fabric cover.

2. The electronic device of claim 1, wherein the second portion of the optically clear adhesive has a second thickness that is less than a first thickness of the woven fabric cover, such that a surface of the second portion is recessed relative to the outside surface of the woven fabric cover.

3. The electronic device of claim 1, further comprising: an anti-glare coating disposed on the outside surface of the woven fabric cover.

4. The electronic device of claim 1, wherein the second portion of the optically clear adhesive comprises a roughened surface that is recessed relative to the outside surface of the woven fabric cover.

5. A cover for an electronic device comprising:
a first fiber segment;
a second fiber segment coupled to the first fiber segment, wherein the first fiber segment and the second fiber segment together define an opening in the cover; and
an optically clear adhesive, wherein a first portion of the optically clear adhesive is disposed in the opening, wherein the optically clear adhesive has a refractive index value of between about 1.3 and about 1.6, and wherein a first thickness of the first portion is less than a second thickness of the cover; and
wherein the cover is transmissive to visible light.

6. The cover of claim 5, wherein the first portion comprises a surface that is recessed relative to a first surface of the cover.

7. The cover of claim 6, wherein the surface comprises a plurality of surface features configured to scatter light.

8. The cover of claim 6, wherein the surface is substantially planar.

9. The cover of claim 5, further comprising:
a second portion of the optically clear adhesive disposed on a first surface of the cover.

10. The cover of claim 9, further comprising:
an anti-glare coating disposed on a second surface of the cover opposite the first surface.

11. The cover of claim 5, wherein the first thickness is greater than half the second thickness.

12. The cover of claim 5, wherein the first thickness is less than half the second thickness.

13. The cover of claim 5, wherein the optically clear adhesive is patterned onto a first portion of the cover, and wherein a second portion of the cover is devoid of optically clear adhesive.

14. A device comprising:
a display element;
a cover disposed about the display element, the cover comprising:
a plurality of openings extending through the cover; and
an optically clear adhesive that at least partially fills individual openings of the plurality of openings, wherein the optically clear adhesive has a refractive index value of between about 1.3 and about 1.6, and wherein a first thickness of a first portion of the optically clear adhesive is less than a second thickness of the cover.

15. The device of claim 14, wherein the optically clear adhesive comprises a surface that is recessed relative to an outside surface of the cover.

16. The device of claim 15, wherein the surface comprises a plurality of surface features.

17. The device of claim 14, wherein the cover comprises cross-hatched fibers.

18. The device of claim 14, wherein the cover further comprises:
an anti-glare coating disposed on an outside surface of the cover.

19. The device of claim 14, wherein the cover further comprises:
an optically clear adhesive layer disposed on an inside surface of the cover.

20. The device of claim 14, wherein the first thickness is greater than half the second thickness.

* * * * *